United States Patent
Ward

Patent Number: 5,132,577
Date of Patent: Jul. 21, 1992

[54] HIGH SPEED PASSGATE, LATCH AND FLIP-FLOP CIRCUITS

[75] Inventor: Michael G. Ward, Saco, Me.

[73] Assignee: National Semiconductor Corporation, Santa Clara, Calif.

[21] Appl. No.: 684,043

[22] Filed: Apr. 11, 1991

[51] Int. Cl.[5] .................. H03K 17/60; H03K 19/02
[52] U.S. Cl. .................... 307/570; 307/446; 307/262; 307/279; 307/287; 307/272.2; 307/291
[58] Field of Search ........ 307/443, 496, 570, 262-263, 307/279, 287, 291, 272.2; 377/74, 78-79

[56] References Cited

U.S. PATENT DOCUMENTS

| | | | |
|---|---|---|---|
| 4,703,203 | 10/1987 | Gallup et al. | 307/446 |
| 4,849,658 | 7/1989 | Iwamura et al. | 307/446 |
| 5,017,808 | 5/1991 | Ueno et al. | 307/570 |

OTHER PUBLICATIONS

IBM Tech. Disc. Bul. vol. 32 No. 10A Mar. 1990 "CMOS Clamp diodes for improved full-swing fully-complementary MOS/bipolar logic circuits".

Primary Examiner—Stanley D. Miller
Assistant Examiner—Margaret Wambach
Attorney, Agent, or Firm—James W. Rose; Daniel H. Kane

[57] ABSTRACT

A BICMOS passgate circuit (PSGT3) (PSGT3A) for use in latches and flip-flops incorporates a bipolar output circuit (Q1,Q3) comprising a bipolar pullup transistor element (Q1) and a bipolar pulldown transistor element (Q3) coupled to the passgate output ($V_{OUT}$) for transient charging and discharging of load capacitance ($C_L$) at the passgate output ($V_{OUT}$). The bipolar output circuit provides increased sinking and sourcing output drive current and $\beta$ amplification of sinking and sourcing drive current at the passgate output $V_{OUT}$ in response to data signals at the passgate intput ($V'_{IN}$) in the transparent operating mode. An MOS input logic circuit coupled to the passgate input ($V'_{IN}$) includes clock signal inputs ($\overline{CP},CP$) for implementing transparent and blocking operating modes. The MOS input logic circuit (QP3,QP4,QP5,QP6, NAND1) is coupled to the bipolar output circuit (Q1,Q3) and is constructed to control the conducting states of the bipolar pullup (Q1) and pulldown (Q3) transistor elements for transient turn on of one of the respective bipolar pullup and pulldown transistor elements during respective switching transitions at the passgate output ($V_{OUT}$). The MOS input logic circuit is also constructed for turn off of the bipolar pullup (Q1) and pulldown (Q3) transistor elements follow switching transitions at the output ($V_{OUT}$) and during the blocking operating mode. A final latchback circuit (LTBK2) (INV3,INV4) is coupled to the passgate output to latch an output data signal and for pulling up the final output ($V_{OUT}$) to a high potential level power rail ($V_{cc}$).

20 Claims, 4 Drawing Sheets

LH PROPAGATION DELAY FROM CLK TO $V_{OUT}$ FOR FIG 1 & FIG 3
FIG 1 OLD = 2.05nS   FIG 2 NEW = 1.53nS   $V_{CC}$ = 4.5v
FOR CLK MEASURED AT $V_{CC}/2$ = 2.25v

FIG 4

$V_{OUT}$ NEW (FIG 3)   $V_{OUT}$ OLD (FIG 1)   CLK

HL PROPAGATION DELAY FROM CLK TO $V_{OUT}$ FOR FIG 1 & FIG 3
FIG 1 OLD = 1.60nS   FIG 2 NEW = 1.38nS   $V_{CC}$ = 4.5v
FOR CLK MEASURED AT $V_{CC}/2$ = 2.25v

HIGH SPEED PASSGATE, LATCH AND FLIP-FLOP CIRCUITS

TECHNICAL FIELD

This invention relates to new passgate, latch and flip-flop circuits which reduce the signal propagation delay from clock signal to output signal. The invention is incorporated for example in latchable buffers coupled in parallel such as octal flip-flops and latches used for accumulating asynchronous input data signals and for clocking synchronized output data signals. It is particularly suited for flip-flops and latchable buffers driving output buffers of large "geometry" and for driving relatively large output load capacitance. The invention is applicable to BICMOS integrated circuit fabrication processes and combines an MOS input logic circuit with a bipolar output circuit for charging and discharging output load capacitance with increased sourcing and sinking output drive currents.

BACKGROUND ART

Figure 1:
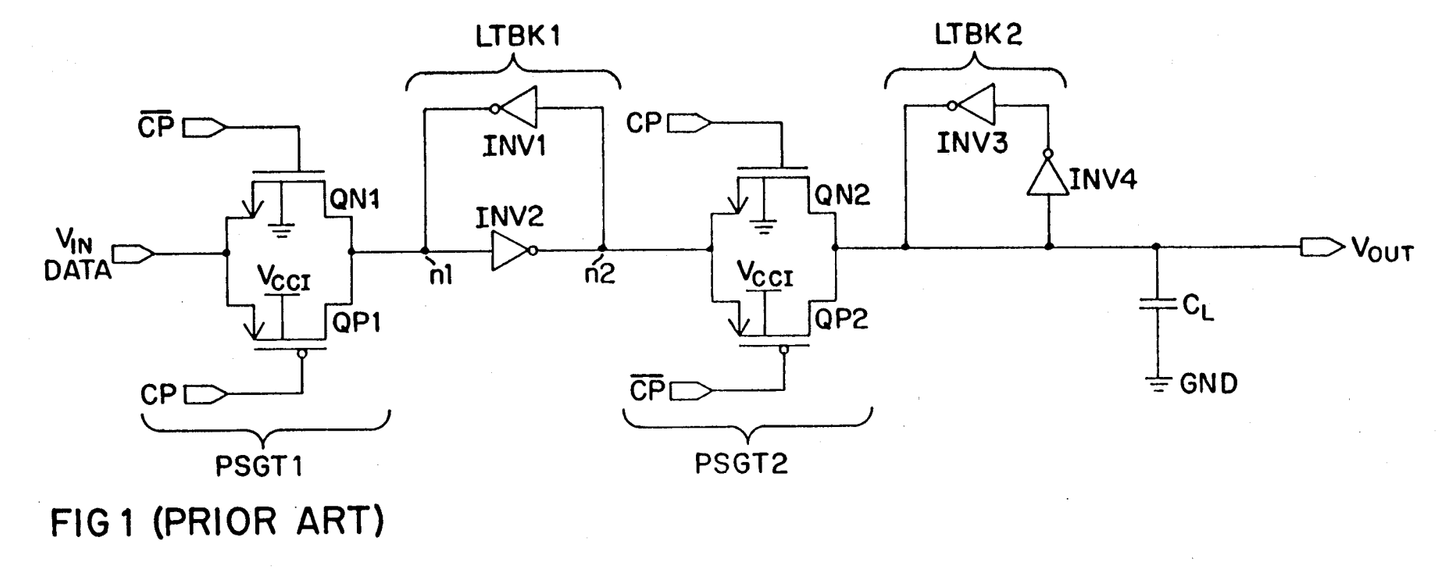
FIG. 1 is a simplified schematic circuit diagram of a conventional D-type flip-flop used as a latchable buffer circuit for example in octal flip-flops and latches.

A prior art D-type flip-flop circuit formed by first and second latch circuits is illustrated in FIG. 1. The first latch is provided by an MOS first passgate PSGT1 having a first input $V_{IN}$ for receiving data signals, a first output n1 for transmitting data signals in the transparent operating mode, and an MOS first latchback circuit LTBK1 for latching a data signal at the non-inverting first output node n1. An inverting output of LTBK1 is provided at node n2. The second latch is provided by an MOS second passgate circuit PSGT2 having a second input coupled to the inverting output n2 from first latchback circuit LTBK1 and a second and final output ($V_{OUT}$) which charges and discharges load capacitance $C_L$ coupled to the final output. An MOS second latchback circuit LTBK2 is coupled to the second output $V_{OUT}$ for latching a data signal at the final output.

When clock signal $\overline{CP}$ is at high potential level, clock signal CP is at low potential level. Passgate NMOS transistor element QN1 and PMOS transistor element QP1 are both conducting and the first passgate PSGT1 is in the transparent operating mode. A data signal applied at the first input $V_{IN}$ therefore appears at the first output n1 and is latched by latchback circuit LTBK1 provided by CMOS inverter stages INV2, INV1. An inverted data signal is latched by the first latchback circuit LTBK1 at node n2 which provides the input to second passgate PSGT2.

With clock signals $\overline{CP}$ high and CP low the passgate NMOS transistor element QN2 and PMOS transistor element QP2 are not conducting and the second passgate circuit PSGT2 is in the blocking mode. When the clock signals switch to $\overline{CP}$ low and CP high the second passgate circuit PSGT2 becomes transparent passing the inverted data signal from node n2 to the second output $V_{OUT}$ where it is latched by the second latchback circuit LTBK2. The MOS inverter stages INV3, INV4 of LTBK2 are coupled to provide a non-inverting latch of data signals at $V_{OUT}$. The final output data signal at $V_{OUT}$ is therefore inverted with respect to the corresponding input data signal at the first input $V_{IN}$.

Figure 2:
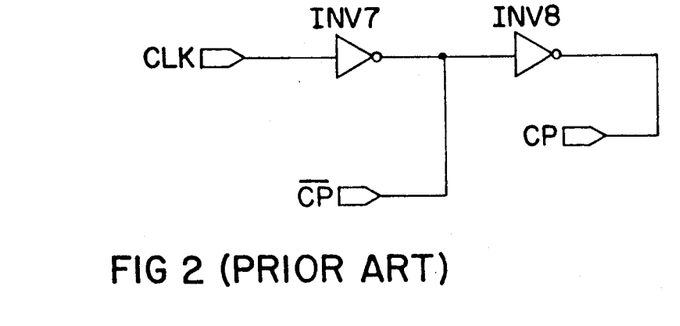
FIG. 2 is a simplified schematic circuit diagram of the clock buffer circuit for use with the circuits of FIGS. 1, 3 and 6.

The clock signals $\overline{CP}$ and CP are derived from original clock signal CLK by the clock buffer illustrated in FIG. 2. The speed of the flip-flop or latchable buffer circuit is the standard signal propagation delay time measured from the occurrence of the original clock signal CLK to occurrence of the output high or low potential level data signal at the final output $V_{OUT}$. A disadvantage of the flip-flop circuit of FIG. 1 is that the signal propagation delay time $T_P CLK/V_{OUT}$ according to the standard measure is dependent upon and delayed by an RC time constant. The capacitance of the RC time constant is the capacitance associated with the CMOS inverter gate INV4 of the output latchback circuit LTBK2 and the load capacitance $C_L$. The load capacitance $C_L$ is for example associated with the next stage coupled to the final output $V_{OUT}$. The resistance in the RC time constant is inversely proportional to the size and therefore current carrying capacity of the second passgate transistor elements QN2, QP2 and the drive transistor elements of CMOS inverter gate INV2.

If the layout area in the IC geometry is not an issue, the size of the passgate transistor elements QN2, QP2 of passgate PSGT2 as well as the size of the pullup and pulldown transistor elements of CMOS inverter gate INV2 may be increased until a desired propagation delay $T_P CLK/V_{OUT}$ is achieved. However as the size of the passgate transistor elements increases, the capacitive log charged and discharged by clock pulse signals CP and $\overline{CP}$ also increases. Eventually the operating time of the clock buffer of FIG. 2 will slow down because of the time required for charging and discharging the gate electrodes of the passgate transistor elements. Furthermore additional IC layout space is required for the geometry of the larger transistors.

OBJECTS OF THE INVENTION

It is therefore an object of the present invention to provide new passgate, latch, and flip-flop circuits and generally latchable buffer circuits with reduced data signal propagation time $T_P CLK/V_{OUT}$ from clock signals to final output data signals with increased switching transition speed at the final output.

Another object of the invention is to provide increased sinking and sourcing output drive current at outputs of passgates, latches, and flip-flops to reduce output load capacitance charging and discharging time and increase speed of switching transitions at the output.

A further object of the invention is to provide BICMOS passgate circuits incorporating advantages of both MOS and bipolar technologies for increasing output drive current while maintaining IC component area less than or equal to that required for conventional all MOS passgates.

DISCLOSURE OF THE INVENTION

In order to accomplish these results the invention provides a passgate circuit having a bipolar output circuit comprising a bipolar pullup transistor element and a bipolar pulldown transistor element coupled to the passgate output for transient charging and discharging of load capacitance at the passgate output. An advantage of the bipolar output circuit is that it provides increased sinking and sourcing output drive current during switching transitions at the passgate output in response to data signals at the passgate input in the transparent operating mode. Additionally, the bipolar pulldown transistor element provides β amplification of sinking current for the HL transition at the output.

According to the invention an MOS input logic circuit is coupled to the passgate input and incorporates clock signal inputs coupled for implementing transparent and blocking operating modes of the passgate in response to selected clock signals. The MOS input logic circuit is coupled to the bipolar output circuit and is constructed for controlling the conducting state of the bipolar output circuit for transient turn on of one of the bipolar pullup and pulldown transistor elements during respective switching transitions at the passgate output in the transparent operating mode. The MOS input logic circuit provides turn off of the respective bipolar pullup and pulldown transistor elements following the switching transition at the passgate output and during the blocking operating mode of the passgate circuit.

The BICMOS passgate circuit is incorporated in a latch with an MOS output latchback circuit coupled to the passgate output for latching a data signal at the passgate output. An advantage of the output latchback circuit is that it also completes pulling up the passgate output to the high potential level $V_{cc}$ power rail.

The MOS input logic circuit is provided by first and second MOS pullup transistor elements coupled in series to a base node of the bipolar pullup transistor element. The gate node of the first pullup transistor element is coupled to the passgate input while the gate node of the second MOS pullup transistor element is coupled to a clock signal input. The MOS input logic circuit also includes third and fourth MOS pullup transistor elements coupled in series to a base node of the bipolar pulldown transistor element. The gate node of the third MOS pullup transistor element is coupled to the passgate input through a first logic gate while the fourth MOS pullup transistor element is also coupled to the clock signal input.

The first logic gate of the MOS input logic circuit has inputs coupled respectively to the passgate input and the passgate output. The logic gate output is coupled to a gate node of the third MOS pullup transistor element which is in turn coupled to the base node of the bipolar pulldown transistor element. The first logic gate therefore conditions control of the bipolar pulldown transistor element on the data signals at the passgate input and output and the clock signal at the clock signal input.

According to a further embodiment of the invention, the MOS input logic circuit includes a second logic gate having logic gate inputs coupled respectively to the passgate input and the passgate output. The logic gate output of the second logic gate is coupled to a gate node of the first MOS pullup transistor element which is in turn coupled to the base node of the bipolar pullup transistor element. The second logic gate therefore conditions control of the bipolar pullup transistor element on the data signals at the respective passgate input and output as well as the clock signal at the clock signal input.

According to this alternative embodiment of the BICMOS passgate, an MOS passgate circuit is coupled in parallel with the BICMOS passgate circuit between input and output latchback circuits. The BICMOS passgate therefore functions as a transient passgate enhancer for the conventional MOS passgate circuit during switching transitions at the combined output. The BICMOS passgate circuit provides transient increase of sourcing and sinking output base drive current with $\beta$ amplification of sinking current during the switching transitions at the output.

The BICMOS passgate circuit is also incorporated in flip-flop circuits, for example, composed of first and second latches coupled in series. The BICMOS passgate circuit provides the passgate in the second latch of the flip-flop circuit. Alternatively, the BICMOS passgate circuit may be used to enhance operation of a conventional MOS passgate in the second latch of the flip-flop driving the final output.

Other objects, features and advantages of the invention are apparent in the following specifications and accompanying drawings.

DESCRIPTION OF PREFERRED EXAMPLE EMBODIMENTS AND BEST MODE OF THE INVENTION

Figure 3:
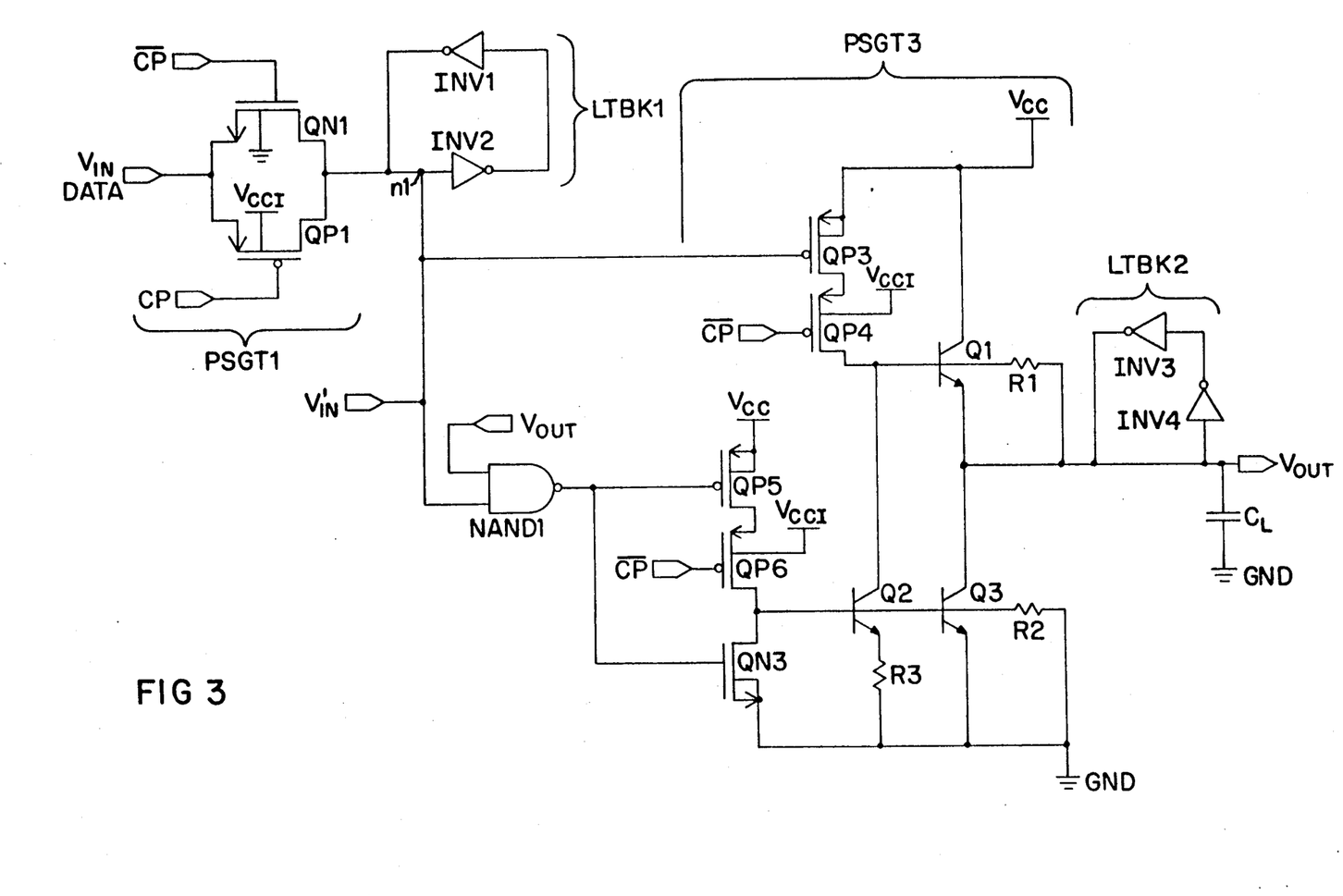
FIG. 3 is a detailed schematic circuit diagram of a BICMOS flip-flop circuit according to the invention incorporating the BICMOS passgate circuit as a replacement for a conventional MOS passgate circuit in the second latch of the flip-flop circuit.

A BICMOS flip-flop circuit according to the invention is illustrated in FIG. 3. Circuit components performing substantially the same or similar circuit functions as the circuit components of the flip-flop circuit of FIG. 1 are indicated by the same reference designations. In place of the conventional MOS second passgate circuit PSGT2, a BICMOS passgate PSGT3 is coupled between the first latchback circuit LTBK1 and the second latchback circuit LTBK2. Furthermore the second input $V'_{IN}$ of the BICMOS second passgate PSGT3 is coupled to the non-inverting first output node n1 from the MOS first passgate PSGT1 and MOS first latchback circuit LTBK1.

The BICMOS second passgate PSGT3 incorporates a bipolar output circuit with a bipolar pullup transistor element Q1 and bipolar pulldown transistor element Q3 coupled to the passgate output $V_{OUT}$ which also provides the final output of the flip-flop circuit. The bipolar pullup transistor element Q1 is coupled between the high potential level power rail $V_{CC}$ and the second output $V_{OUT}$ for sourcing output current to charge output load capacitance $C_L$ and the capacitance presented by the output latchback circuit LTBK2. The bipolar pulldown transistor element Q3 is coupled between the second output $V_{OUT}$ and the low potential level power rail GND to provide sinking output drive current for discharging the load capacitance $C_L$ and the capacitance of the output latchback circuit LTBK2.

The bipolar output circuit also includes an anti-simultaneous conduction bipolar transistor element Q2 coupled between the base node of the bipolar pullup transistor element Q1 and the low potential level power rail GND. The base node of anti-simultaneous conduction transistor element Q2 is coupled to the base node of bipolar pulldown transistor element Q3 for operation of Q2 and Q3 in phase. When the pulldown transistor element Q3 becomes conducting, anti-simultaneous conduction transistor element Q2 rapidly turns off the pullup transistor element Q1. Ballast resistor R3 prevents current hogging between the parallel pulldown transistor elements Q2,Q3. Furthermore, bipolar transistor element Q2 is a minimum size transistor for performing the anti-simultaneous conduction function only.

The bipolar output circuit Q1,Q3 is intended for transient operation during switching transitions at the output. As hereafter described an MOS input logic circuit therefore controls the bipolar pullup and pulldown transistor elements Q1,Q3 for transient turn on during AC events at the output and not during DC steady state conditions. The bipolar output circuit provides a voltage amplifier for $\beta$ amplification of output drive sinking current and $\beta$ amplification of output drive sourcing current for increased switching speed.

For control of the bipolar output pulldown transistor element Q3, the MOS input logic circuit includes PMOS pullup transistor elements QP5,QP6 coupled in series between the high potential level power rail $V_{CC}$ and the base node of Q3. The gate of PMOS pullup transistor element QP5 is coupled to the logic gate output of a first logic gate NAND1 having two logic gate inputs coupled respectively to the second passgate input or second input $V'_{IN}$ and the second output $V_{OUT}$. The gate lead of PMOS pullup transistor element QP6 is coupled to the clock pulse input $\overline{CP}$. Turn on of the pulldown transistor element Q3 is therefore conditioned by the data signals at the second passgate input and output $V'_{IN}$, $V_{OUT}$ and the clock signal at the clock pulse input $\overline{CP}$.

An NMOS pulldown transistor element QN3 is coupled between the base node of pulldown transistor element Q3 and the low potential power rail GND. The gate of QN3 is coupled to the logic gate output of first logic gate NAND1 so that it operates out of phase with the PMOS pullup transistor element QP5. NMOS pulldown transistor element QN3 when conducting therefore performs the functions of an AC and DC Miller killer transistor element holding off Q3. When AC and DC Miller killer transistor element QN3 is off bleed resistor R2 provides a relatively low impedance path to ground for dissipating stray charge and circuit noise to ground.

For the pullup transistor element Q1, the MOS input logic circuit includes PMOS pullup transistor elements QP3 and QP4 coupled in series between the high potential level power rail $V_{CC}$ and the base node of Q1. The gate of PMOS pullup transistor element QP3 is coupled to the second passgate input $V'_{IN}$ while the gate of QP4 is coupled to the clock pulse input $\overline{CP}$. The conducting state of pullup transistor element Q1 is therefore conditioned on the data signal at the second input $V'_{IN}$ and the clock signal at the clock pulse input $\overline{CP}$. When QP3 and QP4 are not conductive bleed resistor R1 performs a function similar to R2 in providing a relatively low impedance path to ground for charge and circuit noise so that pullup transistor element Q1 does not turn on. The transient operation of the bipolar output pullup and pulldown transistor elements Q1,Q3 is hereafter described.

For the steady state condition with a logic high data signal at the first input $V_{IN}$ and a logic low data signal at the final output $V_{OUT}$ neither of the bipolar pullup or pulldown transistor elements Q1,Q3 is conducting. With $V'_{IN}$ high and $V_{OUT}$ low in the MOS input logic circuit, neither of the PMOS pullup transistor elements QP3,QP5 is conducting. Similarly if the BICMOS second passgate PSGT3 is in the blocking mode with clock pulse signal $\overline{CP}$ high neither of the PMOS pullup transistor elements QP4,QP6 is conducting. NMOS pulldown transistor element QN3 functions as a DC Miller killer transistor element so that stray charge and noise cannot turn on Q3.

For a low to high (LH) transition at the output $V_{OUT}$, a logic low signal appears at the first input $V_{IN}$. With clock pulses $\overline{CP}$ high and CP low, the first passgate PSGT1 passes the logic low signal through node n1 to the second input $V'_{IN}$. $V_{OUT}$ still remains low. The first logic gate NAND1 therefore continues to hold off the bipolar pulldown transistor element Q3. PMOS pullup transistor element QP3 however becomes conducting. Upon transition of the clock pulse signals to $\overline{CP}$ low and CP high, the BICMOS passgate PSGT3 is in the transparent operating mode. With QP3 and QP4 conducting, the bipolar pullup transistor element Q1 turns on, rapidly charges the output load capacitance, and pulls up the second output $V_{OUT}$ to $1V_{BE}$ below $V_{CC}$. Latchback circuit LTBK2 and INV4 completes the pullup of the output $V_{OUT}$ to $V_{CC}$. With logic high signals on both sides of the base-emitter junction of bipolar pullup transistor element Q1, Q1 turns off upon completion of the LH transition at the output.

During the LH transition at the output with the BICMOS second passgate PSGT3 in the transparent operating mode, PMOS transistor element QP5 is off while QP6 is conducting and discharges the drain capacitance of QP5 into the base nodes of bipolar pulldown transistor elements Q2,Q3. AC and DC Miller killer NMOS transistor element QN3 is conducting and diverts this charge to ground. Alternatively, the low impedance path to ground afforded by resistor R2 also prevents Q2 and Q3 from turning on and simultaneous conduction is minimized. Resistor R1 substantially equalizes the voltage across the base-emitter junction of Q1 and prevents stray charge and noise from turning on Q1.

For the steady state condition of a logic low signal at the first input $V_{IN}$ and a logic high signal at the final output $V_{OUT}$, the bipolar pullup and pulldown transistor elements Q1,Q3 are similarly not conducting. With a $V'_{IN}$ low signal and a $V_{OUT}$ high signal the first logic gate NAND1 holds off the bipolar pulldown transistor element Q3 for whatever value of the clock signal at clock input $\overline{CP}$ for heretofore described. Even though PMOS transistor element QP3 may be conducting, the logic high signal at both sides of the base-emitter junction of Q1 prevents the bipolar pullup transistor element Q1 from turning on.

For a high to low (HL) transition at the final output $V_{OUT}$ a logic high signal appears at the first input $V_{IN}$. With clock signals $\overline{CP}$ high and CP low, the first passgate PSGT1 is in the transparent mode and passes the logic high signal through first output node n1 to the second input $V'_{IN}$. $V_{OUT}$ is still high. The logic gate output of the first logic gate NAND1 therefore goes low and turns on the PMOS pullup transistor element QP5. PMOS pullup transistor element QP3 is off. Upon switching of the clock signals to $\overline{CP}$ low and CP high (PSGT3 in the transparent operating mode), both QP5 and QP6 are conducting turning on the bipolar pulldown transistor element Q3. Anti-simultaneous transistor element Q2 holds off the bipolar pullup transistor element Q1. QP4 therefore discharges the drain capacitance of QP3 through the anti-simultaneous conduction transistor element Q2 rather than into the base of Q1.

Bipolar pulldown transistor element Q3 rapidly discharges the output load capacitance and pulls down the final output $V_{OUT}$ to $1V_{SAT}$ above ground. Latchback circuit LTBK2 and in particular inverter stage INV4 completes the pulldown of $V_{OUT}$ to ground. With $V_{OUT}$ low, the NAND 1 logic gate output switches to logic high shutting off QP5 and the bipolar pulldown Q3.

Figure 4:
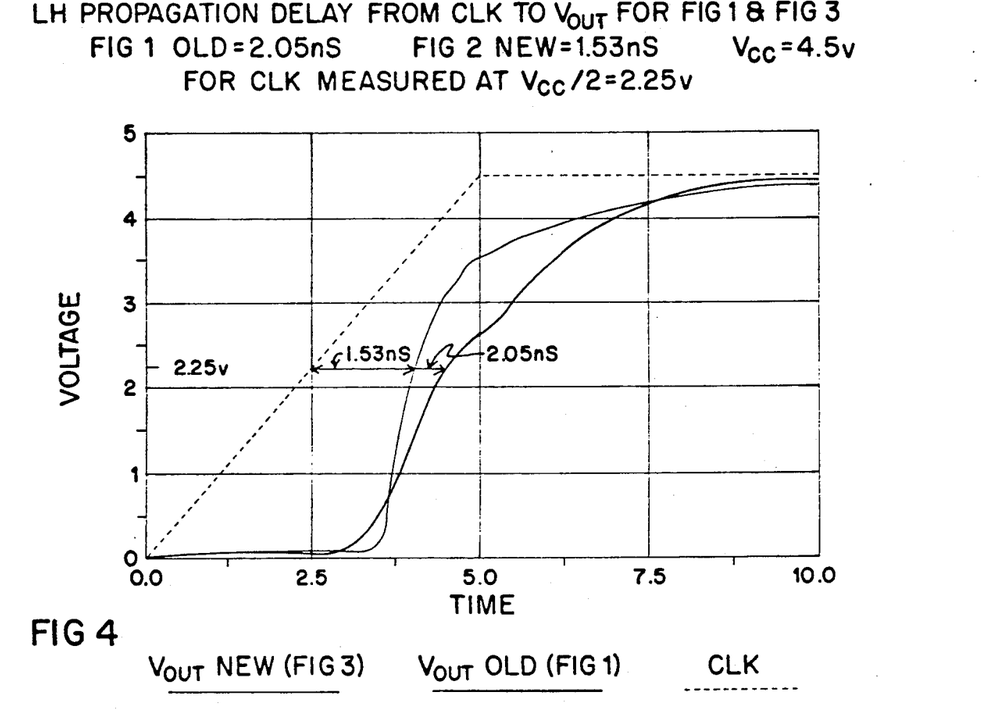
FIG. 4 is a graph comparing the propagation delay $T_P$ CLK/$V_{OUT}$ during a low to high (LH) switching transition at the final output of the circuits of FIGS. 1 & 3.
Figure 5:
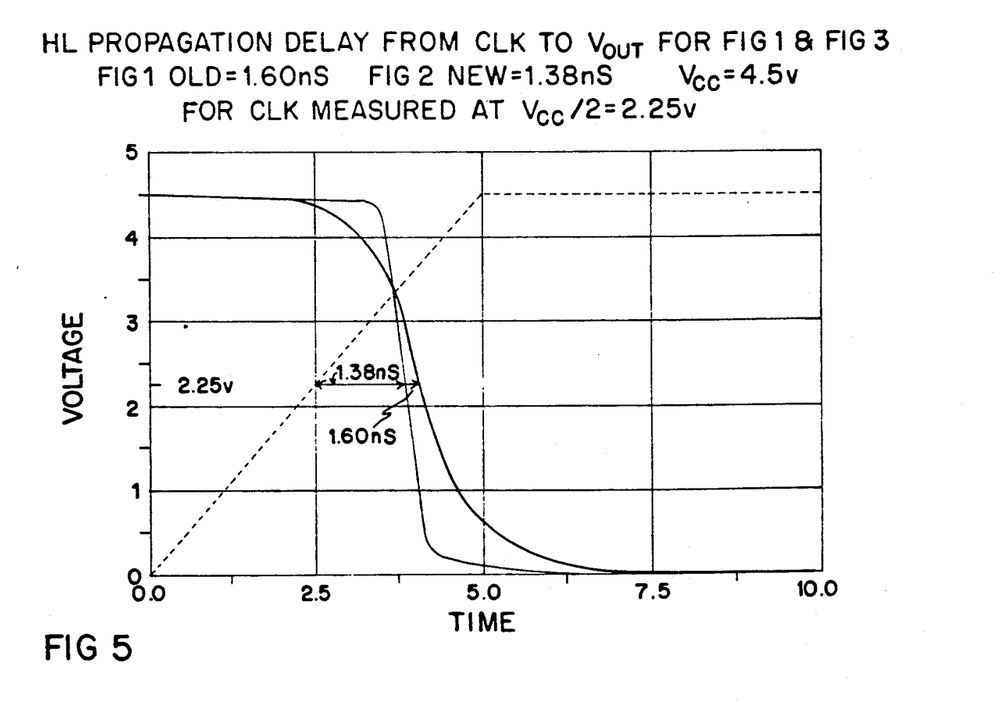
FIG. 5 is a graph comparing the signal propagation delay $T_P$ CLK/$V_{OUT}$ during high to low (HL) switching transition at the final output of the circuits of FIGS. 1 & 3.

A graph plotting and comparing the respective propagation delay times for the circuits of FIGS. 1 & 3 from the clock signal to final output signal $T_P CLK/V_{OUT}$ for the LH transition at the output is shown in FIG. 4. Propagation delay times are measured for the clock signal at 2.25 v = $V_{cc}/2$. The BICMOS passgate flip-flop circuit of FIG. 3 achieves a reduction in propagation delay time from 2.05nS to 1.53nS. A comparison of the respective propagation delay times for the HL transition at the output is shown in FIG. 5. The BICMOS passgate flip-flop circuit of FIG. 3 achieves a reduction in propagation delay time from 1.60nS to 1.38nS.

A further advantage of the flip-flop circuit of FIG. 3 is that the inverter buffer INV8 in the clock buffer of FIG. 2 for producing clock pulse CP can be reduced in size. This reduces the capacitive load on CP inverter INV7 for speed up of the clock buffer circuit. Similarly the size of inverter INV2 of LTBK1 can be reduced, further saving layout space.

Figure 6:
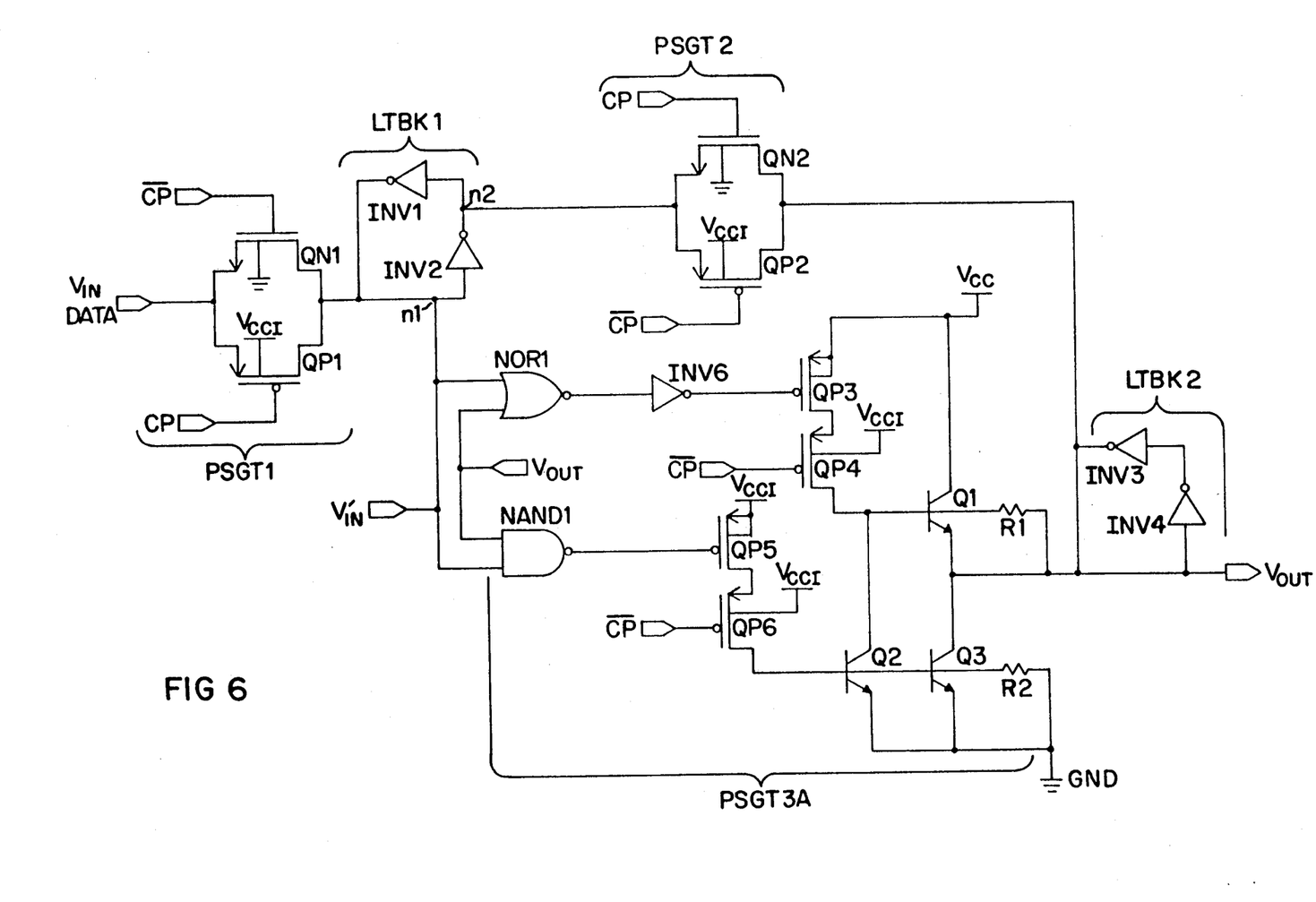
FIG. 6 is a detailed schematic circuit diagram of an alternative BICMOS flip-flop circuit according to the invention in which the BICMOS passgate circuit is incorporated as an enhancer to a conventional MOS passgate circuit in the second latch of the flip-flop.

An alternative circuit embodiment of the invention is illustrated in the flip-flop circuit of FIG. 6. Circuit components performing the same or similar functions as the circuit components of the flip-flop circuits of FIGS. 1 & 3 are indicated by the same reference designations. In the flip-flop circuit of FIG. 6 the BICMOS second passgate circuit PSGT3A is incorporated into the flip-flop circuit as a passgate enhancer circuit in parallel with the conventional MOS passgate circuit PSGT2 forming a third passgate circuit. The second and third passgate circuits PSGT3A and PSGT2 are coupled in parallel between the first and second latchback circuits LTBK1 and LTBK2. The MOS first passgate circuit PSGT1 is coupled at the first input $V_{IN}$ as heretofore described. The flip-flop circuit of FIG. 6 is an inverting flip-flop circuit as are the flip-flop circuits of FIGS. 1 & 3.

In the flip-flop circuit of FIG. 6 the BICMOS second passgate circuit PSGT3A provides transient enhancement of output drive current during AC switching events. The steady state conditions of the circuit are maintained through the MOS third passgate circuit PSGT2.

The BICMOS second passgate circuit PSGT3A incorporates most of the circuit elements of the BICMOS second passgate circuit PSGT3 of FIG. 3. In the example of FIG. 6 the AC and DC Miller killer transistor element QN3 and ballast resistor R3 have been deleted and bleed resistor R2 provide the only low impedance path to ground for holding off Q2 and Q3. In the BICMOS passgate circuit PSGT3A a second logic gate NOR1/INV6 is added providing positive control over the transient operation of the bipolar pullup transistor element Q1 through PMOS pullup transistor element QP3. In the operation of the BICMOS passgate PSGT3A in the flip-flop circuit of FIG. 6, the second logic gate NOR1/INV6 causes PMOS pullup transistor element QP3 to turn on for the LH transition at the output $V_{OUT}$. Once the output $V_{OUT}$ is at logic high the second logic gate NOR1/INV6 actively turns off QP3. For the HL transition at the output $V_{OUT}$ the second logic gate NOR1/INV6 provides positive turn off of QP3.

While the invention has been described with reference to particular example embodiments it is intended to cover all modifications and equivalents within the scope of the following claims.

I claim:

1. A passgate circuit having a passgate input ($V'_{IN}$) for receiving data signals, a transparent operating mode for passing data signals, a blocking operating mode for blocking data signals, and a passgate output ($V_{OUT}$) for transmitting data signals in the transparent operating mode comprising:

a bipolar output circuit (Q1,Q3) comprising a bipolar pullup transistor element (Q1) and a bipolar pulldown transistor element (Q3) coupled to the passgate output ($V_{OUT}$) for transient charging and discharging load capacitance ($C_L$) at the passgate output ($V_{OUT}$) with sinking and sourcing output drive current during respective LH and HL switching transitions at the passgate output ($V_{OUT}$) in response to data signals at the passgate input ($V'_{IN}$) in the transparent operating mode;

and an MOS input logic circuit coupled to the passgate input ($V'_{IN}$) and having clock signal inputs ($\overline{CP}$,CP) coupled for implementing the transparent and blocking operating modes in response to selected clock signals, said MOS input logic circuit being coupled to the bipolar output circuit and being constructed for controlling the conducting states of the bipolar output circuit for transient turn on of one of the bipolar pullup and pulldown transistor elements during respective LH and HL switching transitions at the passgate output ($V_{OUT}$) in the transparent operating mode, and for turn off of the bipolar pullup and pulldown transistor elements following the switching transition at the passgate output and during the blocking operating mode of the passgate circuit;

said MOS input logic circuit comprising at least one logic gate having as one input a feedback data signal from the passgate output ($V_{OUT}$), said logic gate being coupled to control at least one of the bipolar pullup or pulldown transistor elements (Q1,Q3) for turn off of said pullup or pulldown transistor element following a respective LH or HL switching transition at the output ($V_{OUT}$).

2. The passgate circuit (PSGT3) (PSGT3A) of claim 1 comprising an MOS output latchback circuit (LTBK2) (INV3, INV4) coupled to the passgate output ($V_{OUT}$) for latching a data signal at the passgate output and for pulling up the passgate output ($V_{OUT}$) to a high potential level power rail ($V_{CC}$).

3. The passgate circuit (PSGT3) (PSGT3A) of claim 1 wherein the MOS input logic circuit comprises first MOS pullup transistor means (QP3,QP4) coupled between a high potential power rail ($V_{CC}$) and a base node of the bipolar pullup transistor element (Q1) for sourcing current to the base node of the bipolar pullup transistor element (Q1) and second MOS pullup transistor means (QP5,QP6) coupled between the high potential power rail ($V_{CC}$) and a base node of the bipolar pulldown transistor element (Q3) for sourcing current to the base node of the bipolar pulldown transistor element (Q3), said first and second MOS pullup transistor means being coupled for transient turn on of one of the bipolar pullup and pulldown transistor elements during respective switching transitions at the passgate output ($V_{OUT}$).

4. The passgate circuit (PSGT3) (PSGT3A) of claim 3 wherein the first MOS pullup transistor means (QP3, QP4) coupled to a base node of the bipolar pullup transistor element (Q1) comprises first and second MOS pullup transistor elements coupled in series between the high potential power rail ($V_{CC}$) and the base node of the bipolar pullup transistor element (Q1), said first MOS pullup transistor element (QP3) having a gate node coupled to the passgate input ($V'_{IN}$) and said second MOS pullup transistor element (QP4) having a gate node coupled to a clock signal input ($\overline{CP}$);

and wherein the second MOS pullup transistor means (QP5,QP6) coupled to a base node of the bipolar pulldown transistor element (Q3) comprises third and fourth MOS pullup transistor elements coupled in series between the high potential power rail ($V_{CC}$) and the base node of the bipolar pulldown transistor element (Q3), said third MOS pullup transistor element (QP5) having a gate node coupled to the passgate input ($V'_{IN}$) through a first logic gate (NAND1), and said fourth MOS pullup transistor element (QP6) having a gate node coupled to a clock signal input ($\overline{CP}$).

5. The passgate circuit (PSGT3) (PSGT3A) of claim 4 wherein the first logic gate (NAND1) comprises logic gate inputs coupled respectively to the passgate input ($V'_{IN}$) and the passgate output ($V_{OUT}$) and a logic gate output coupled to a gate node of the third MOS pullup transistor element (QP5) for conditioning control of the bipolar pulldown transistor element (Q3) on the data signals at the passgate input ($V'_{IN}$) and output ($V_{OUT}$) and the clock signal at the clock signal input ($\overline{CP}$).

6. The passgate circuit (PSGT3) (PSGT3A) of claim 5 further comprising an anti-simultaneous conduction second bipolar pulldown transistor element (Q2) coupled to sink current from the bas enode of the bipolar pullup transistor element (Q1) and wherein the second MOS pullup transistor means (QP5,QP6) is coupled to source current to a base node of the anti-simultaneous conduction second bipolar pulldown transistor element (Q2).

7. The passgate circuit (PSGT3) of claim 5 further comprising a Miller killer MOS pulldown transistor element (QN3) coupled to sink current from the base node of the bipolar pulldown transistor element (Q3) and having a gate node coupled to the logic gate output of the first logic gate (NAND1).

8. The passgate circuit (PSGT3A) of claim 4 wherein the MOS input logic circuit comprises a first logic gate (NAND1) having logic gate inputs coupled respectively to the passgate input ($V'_{IN}$) and the passgate output ($V_{OUT}$) and a logic gate output coupled to a gate node of the third MOS pullup transistor element (QP5);

and wherein the MOS input logic circuit further comprises a second logic gate (NOR1,INV6) having logic gate inputs coupled respectively to the passgate input ($V'_{IN}$) and the passgate output ($V_{OUT}$) and a logic gate output coupled to a gate node of the first MOS pullup transistor element (QP3);

said first and second logic gates thereby conditioning control of the bipolar pullup (Q1) and pulldown (Q3) transistor elements on the data signals at the respective passgate input ($V'_{IN}$) and output ($V_{OUT}$) and the clock signals at the clock signal inputs ($\overline{CPP/}$).

9. The passgate circuit (PSGT3A) of claim 8 comprising an MOS input latchback circuit (LKBT1) (INV1,INV2) coupled to the passgate input ($V'_{IN}$), an MOS output latchback circuit (LKBT2) (INV3,INV4) coupled to the passgate output ($V_{OUT}$), and an MOS second passgate circuit (PSGT2) coupled in parallel with said BICMOS passgate circuit (PSGT3A) between the input latchback circuit (LTBK1) and output latchback circuit (LTBK2).

10. A flip-flop circuit comprising:
a first latch circuit having a first input ($V_{IN}$) for receiving data signals and a first output (n1), said first latch circuit comprising an MOS first passgate (PSGT1) coupled to the first input ($V_{IN}$) for passing said data signals in a passing mode and for blocking said data signals in a blocking mode, and an MOS first latchback (LTBK1) coupled to the first output (n1) for latching a data signal at the first output;
and a second latch circuit having a second input ($V'_{IN}$) coupled to the first output (n1) and providing a second output ($V_{OUT}$), said second latch circuit comprising a BICMOS second passgate (PSGT3) (PSGT3A) coupled to the second input ($V'_{IN}$) for passing said data signals in a passing mode and blocking data signals in a blocking mode, and an MOS second latchback (LTBK2) coupled to the second output ($V_{OUT}$) for latching a data signal at the second output and to assist pulling up the second output substantially to a high potential level power rail ($V_{CC}$);
said BICMOS second passgate (PSGT3) comprising an MOS input logic circuit (QP3, QP4, QP5, QP6, NAND1) coupled to the second input ($V'_{IN}$) and a bipolar output circuit (Q1,Q3) coupled to the second output ($V_{OUT}$) for transient increase of second output sourcing and sinking drive current for charging and discharging load capacitance ($C_L$) at the second output ($V_{OUT}$), said MOS input logic circuit being coupled to control the conducting state of the bipolar output circuit (Q1,Q3) for said transient increase of second output sourcing and sinking drive current during switching transitions at the second output ($V_{OUT}$) in response to data signals at the second input ($V'_{IN}$) in the transparent operating mode of the second passgate (PSGT3);
said MOS input logic circuit comprising at least one logic gate having as one input a feedback data signal from the second output ($V_{OUT}$), said logic gate being coupled to control the bipolar output circuit (01,03) for turn off of said bipolar output circuit by the MOS input logic circuit following a switching transition at the second output ($V_{OUT}$).

11. The flip-flop circuit of claim 10 wherein the bipolar output circuit (Q1,Q3) of the BICMOS second passgate (PSGT3) (PSGT3A) comprises bipolar pullup (Q1) and pulldown (Q3) transistor elements coupled to the second output ($V_{OUT}$) for transient sourcing and sinking second output drive current in response to data signals at the second input ($V'_{IN}$).

12. the flip-flop circuit of claim 11 wherein the MOS input logic circuit comprises first MOS pullup transistor means (QP3,QP4) coupled between a high potential power said ($V_{CC}$) and a base node of the bipolar pullup transistor element (Q1) for sourcing current to the base node of the bipolar pullup transistor element (Q1) and second MOS pullup transistor means (QP5,QP6) coupled between the high potential power rail ($V_{CC}$) and a base node of the bipolar pulldown transistor element (Q3) for sourcing current to the base node of the bipolar pulldown transistor element (Q3), said first and second MOS pullup transistor means being coupled for transient turn on of one of the bipolar pullup (Q1) and pulldown (Q3) transistor elements during respective switching transitions at the second output ($V_{OUT}$).

13. The flip-flop circuit of claim 12 wherein the first MOS pullup transistor means (QP3,QP4) coupled to a base node of the bipolar pullup transistor element (Q1) comprises first and second MOS pullup transistor elements coupled in series between the high potential power rail ($V_{CC}$) and the base node of the bipolar pullup transistor element, said first MOS pullup transistor element (QP3) having a gate node coupled to the second input ($V'_{IN}$) and said second MOS pullup transistor element (QP4) having a gate node coupled to a clock signal input ($\overline{CP}$);

and wherein the second MOS pullup transistor means (QP5,QP6) coupled to a base node of the bipolar pulldown transistor element (Q3) comprises third and fourth MOS pullup transistor elements coupled in series between the high potential power rail ($V_{CC}$) and the base node of the bipolar pulldown transistor element, said third MOS transistor element (QP5) having a gate node coupled to the second input ($V'_{IN}$) through a first logic gate (NAND1) and said fourth MOS transistor element (QP6) having a gate node coupled to a clock signal input ($\overline{CP}$).

14. The flip-flop circuit of claim 13 wherein the bipolar output circuit of the BISMOS second passgate (PSGT3) (PSGT3A) comprises an anti-simultaneous conduction second bipolar pulldown transistor element (Q2) coupled to sink current from the base node of the bipolar pullup transistor element (Q1) and wherein the second MOS pullup transistor means (QP5,QP6) is coupled to source current to a base node of the anti-simultaneous conduction second bipolar pulldown transistor element (Q2).

15. The flip-flop circuit of claim 14 wherein the MOS input logic circuit of the BICMOS second passgate circuit (PSGT3) (PSGT3A) comprises a first logic gate (NAND1) having logic gate inputs coupled to the second input ($V'_{IN}$) and the second output ($V_{OUT}$) and a logic gate output coupled to a gate node of the third MOS pullup transistor element (QP5) for conditioning control of the bipolar pulldown transistor element (Q3) on the data signals at the second input ($V_{IN}$) and output ($V_{OUT}$) and a clock signal at a clock signal input ($\overline{CP}$).

16. The flip-flop circuit of claim 13 wherein the MOS input logic circuit of the BICMOS second passgate (PSGT3) comprises an MOS pulldown transistor element (QN3) coupled to sink current from a base node of the bipolar pulldown transistor element (Q3), said MOS pulldown transistor element (QN3) having a gate node coupled to the second input ($V'_{IN}$) through said first logic gate (NAND1).

17. The flip-flop circuit of claim 13 further comprising an MOS third passgate (PSGT2) coupled between the first latchback (LTBK1) and the second output ($V_{OUT}$) in parallel with the BICMOS second passgate (PSGT3A) for passing data signals and for pullup of the second output ($V_{OUT}$) to a high potential level power rail ($V_{CC}$).

18. The flip-flop circuit of claim 17 wherein the MOS input logic circuit of the BICMOS second passgate (PSGT3A) comprises a first logic gate (NAND1) having logic gate inputs coupled respectively to the second input ($V'_{IN}$) and the second output ($V_{OUT}$) and a logic gate output coupled to a gate node of the third MOS pullup transistor element (QP5);

and a second logic gate (NOR1, INV6) having logic gate inputs coupled respectively to the second input ($V'_{IN}$) and the second output ($V_{OUT}$) and a logic gate output coupled to a gate node of the first MOS pullup transistor element (QP3);

said first and second logic gates thereby conditioning control of the bipolar pullup (Q1) and pulldown (Q3) transistor elements on the data signals at the second input ($V'_{IN}$) and output ($V_{OUT}$) and clock signals at the clock signal inputs ($\overline{CPP/}$).

19. The flip-flop circuit of claim 13 wherein the MOS first passgate (PSGT1) comprises complementary clock signal inputs (CP,$\overline{CP}$) for implementing the transparent and blocking modes according to the clock signals at the complementary clock signal inputs, and wherein the BICMOS second passgate (PSGT3) (PSGT3A) comprises clock signal inputs ($\overline{CPP/}$) for implementing the transparent and blocking modes, and wherein the respective first and second passgates are constructed to operate in transparent and blocking operating modes out of phase.

20. A flip-flop circuit comprising:
a first latch circuit comprising an MOS first passgate (PSGT1) having complementary clock signal inputs (CP,$\overline{CP}$) and transparent and blocking operating modes, first input ($V_{IN}$) for receiving data signals of logic high and low potential levels and a first output (n1) for passing data signals in the transparent operating mode, said first latch circuit also comprising a first MOS latchback (LTBK1) coupled to the first output (n1) of the first MOS passgate (PSGT1) for latching a signal at the first output (n1);

and a second latch circuit comprising a BICMOS second passgate (PSGT3) having clock signal inputs ($\overline{CPP/}$) and transparent and blocking operating modes, said BICMOS second passgate having a first input ($V'_{IN}$) coupled to the first output (n1) of the MOS first passgate (PSGT1) for receiving data signals, and a bipolar output circuit (Q1,Q3) providing a second output ($V_{OUT}$), said bipolar output circuit comprising a bipolar pullup transistor element (Q1) and a bipolar pulldown transistor element (Q3) coupled to the second output ($V_{OUT}$) for providing sourcing and sinking second output drive current, and an MOS second latchback (LTBK2) coupled to the second output ($V_{OUT}$) for latching a data signal at the second output and for pulling up the second output to a high potential level power rail ($V_{CC}$);

said MOS input circuit being coupled to control the conducting state of the bipolar output circuit and being constructed for providing transient turn on of one of the bipolar pullup and pulldown transistor elements during switching transitions at the second output ($V_{OUT}$) in response to data signals at the second input ($V'_{IN}$) in the transparent operating mode and for turn off of the bipolar pullup and pulldown transistor elements following switching transistions at the second output ($V_{OUT}$) and during the blocking operating mode;

said MOS first passgate (PSGT1) and said BICMOS second passgate (PSGT3) being constructed for operation in transparent and blocking operating modes out of phase with respect to each other in response to selected clock signals.

* * * * *